US010522405B2

(12) United States Patent
Takenouchi

(10) Patent No.: US 10,522,405 B2
(45) Date of Patent: Dec. 31, 2019

(54) METHOD OF PROCESSING WORKPIECE INCLUDING CUTTING STEP THAT USES CUTTING FLUID WITH ORGANIC ACID AND OXIDIZING AGENT TO REDUCE DUCTILITY OF LAYERED BODIES CONTAINING METAL

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/941,131

(22) Filed: Mar. 30, 2018

(65) Prior Publication Data

US 2018/0286757 A1    Oct. 4, 2018

(30) Foreign Application Priority Data

Apr. 4, 2017   (JP) ................. 2017-074469

(51) Int. Cl.
*H01L 21/78* (2006.01)
*B28D 5/00* (2006.01)
*H01L 21/67* (2006.01)
*B28D 5/02* (2006.01)

(52) U.S. Cl.
CPC ............ *H01L 21/78* (2013.01); *B28D 5/0076* (2013.01); *B28D 5/0094* (2013.01); *B28D 5/023* (2013.01); *H01L 21/67092* (2013.01)

(58) Field of Classification Search
CPC ......... H01L 23/544; H01L 2223/54453–5446; H01L 2223/54473–5448; H01L 21/304–3043; H01L 21/78–86; H01L 2221/68327; B28D 5/022–029
See application file for complete search history.

(56) References Cited

U.S. PATENT DOCUMENTS 6,280,298 B1    8/2001   Gonzales
6,310,017 B1   10/2001   Grant et al.
6,461,940 B1 * 10/2002   Hasegawa ............ B26D 1/0006
                                                        125/13.01

(Continued)

FOREIGN PATENT DOCUMENTS

JP        06349926 A   12/1994
JP        09055573 A    2/1997
JP      2005021940 A    1/2005

OTHER PUBLICATIONS

Takenouchi, Kenji, U.S. Appl. No. 15/934,491, filed Mar. 23, 2018.

(Continued)

*Primary Examiner* — Laura M Menz
*Assistant Examiner* — Candice Chan
(74) *Attorney, Agent, or Firm* — Green Burns & Crain, Ltd.

(57) ABSTRACT

A method of processing a plate-shaped workpiece that includes layered bodies containing metal which are formed in superposed relation to projected dicing lines, includes the steps of holding the workpiece on a holding table, and thereafter, cutting the workpiece along the projected dicing lines with an annular cutting blade, thereby separating the layered bodies. The cutting blade has a slit which is open at an outer peripheral edge thereof. The step of cutting the workpiece includes the step of cutting the workpiece while supplying a cutting fluid containing an organic acid and an oxidizing agent to the workpiece.

14 Claims, 4 Drawing Sheets

(56) References Cited

U.S. PATENT DOCUMENTS

| | | | |
|---|---|---|---|
| 6,791,197 B1 * | 9/2004 | Katz | B28D 5/022 257/48 |
| 9,130,057 B1 | 9/2015 | Kumar et al. | |
| 9,349,647 B2 | 5/2016 | Takenouchi | |
| 2003/0124771 A1 | 7/2003 | Maiz | |
| 2004/0209443 A1 * | 10/2004 | Cadieux | B28D 5/0076 438/460 |
| 2004/0212047 A1 | 10/2004 | Joshi et al. | |
| 2006/0223234 A1 | 10/2006 | Terayama et al. | |
| 2008/0191318 A1 | 8/2008 | Su et al. | |
| 2008/0277806 A1 | 11/2008 | Chen et al. | |
| 2011/0048200 A1 | 3/2011 | Ide et al. | |
| 2012/0286415 A1 | 11/2012 | Sakai et al. | |
| 2013/0203237 A1 | 8/2013 | Yamaguchi et al. | |
| 2013/0234193 A1 | 9/2013 | Odnoblyudov et al. | |
| 2014/0017882 A1 | 1/2014 | Lei et al. | |
| 2014/0154871 A1 | 6/2014 | Hwang et al. | |
| 2015/0262881 A1 * | 9/2015 | Takenouchi | H01L 21/78 438/460 |
| 2017/0213757 A1 | 7/2017 | Nakamura et al. | |
| 2018/0166328 A1 | 6/2018 | Tang et al. | |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/937,402, filed Mar. 27, 2018.
Takenouchi, Kenji, U.S. Appl. No. 15/938,832, filed Mar. 28, 2018.
Takenouchi, Kenji, U.S. Appl. No. 15/938,755, filed Mar. 28, 2018.
Takenouchi, Kenji, U.S. Appl. No. 15/940,468, filed Mar. 29, 2018.
Takenouchi, Kenji, U.S. Appl. No. 15/940,411, filed Mar. 29, 2018.
Takenouchi, Kenji, U.S. Appl. No. 15/942,682, filed Apr. 2, 2018.

* cited by examiner

METHOD OF PROCESSING WORKPIECE INCLUDING CUTTING STEP THAT USES CUTTING FLUID WITH ORGANIC ACID AND OXIDIZING AGENT TO REDUCE DUCTILITY OF LAYERED BODIES CONTAINING METAL

BACKGROUND OF THE INVENTION

Field of the Invention

The present invention relates to a method of processing a plate-shaped workpiece that includes layered bodies containing metal which are formed in superposed relation to projected dicing lines.

Description of the Related Art

Electronic equipment, typically mobile phones and personal computers, incorporates, as indispensable components, device chips that have devices such as electronic circuits, etc. thereon. A device chip is manufactured by demarcating the face side of a wafer made of a semiconductor material such as silicon or the like into a plurality of areas with a plurality of projected dicing lines also known as streets, forming devices in the respective areas, and then dividing the wafer into device chips corresponding to the devices along the projected dicing lines.

In recent years, evaluation elements referred to as TEG (Test Element Group) for evaluating electric properties of devices are often formed on projected dicing lines on wafers as described above (see, for example, Japanese Patent Laid-open No. Hei 6-349926 and Japanese Patent Laid-open No. 2005-21940). The TEG on the projected dicing lines on a wafer makes it possible to maximize the number of device chips that can be fabricated from the wafer. Once the TEG has carried out evaluations and has been made redundant, it can be removed at the same time that the wafer is severed into device chips.

The device chips referred to above are usually encapsulated by resin before they are mounted on boards or the like. For example, a packaged board is produced by encapsulating a plurality of device chips with resin, and then severed along projected dicing lines corresponding to the device chips, obtaining packaged devices that have the respective resin-encapsulated device chips.

A plurality of layered bodies containing metal are provided on the projected dicing lines of the packaged board. When the packaged board is severed, the layered bodies are also severed. The layered bodies are connected to the electrodes of the device chips by metal wires or the like. When the layered bodies are severed together with the packaged board, the layered bodies become electrodes of the packaged devices.

SUMMARY OF THE INVENTION

When layered bodies containing metal that are to function as TEG, electrodes, etc. are cut and removed by a cutting blade which is made of a binder with abrasive grains dispersed therein, the metal contained in the layered bodies is elongated, tending to give rise to protrusions called "burrs" due to contact with the cutting blade. If the cutting blade processes the wafer at an increased rate, then it generates more heat that is liable to produce larger burrs. Therefore, according to the processing method using the cutting blade, it is necessary to reduce the processing rate so as not to lower the quality of the processing of the wafer.

It is therefore an object of the present invention to provide a method of processing a plate-shaped workpiece that includes layered bodies containing metal which are formed in superposed relation to projected dicing lines, at an increased rate while keeping the quality of the processing of the workpiece.

In accordance with an aspect of the present invention, there is provided a method of processing a plate-shaped workpiece that includes layered bodies containing metal which are formed in superposed relation to projected dicing lines, including the steps of holding the workpiece on a holding table, and thereafter, cutting the workpiece along the projected dicing lines with an annular cutting blade, thereby separating the layered bodies, in which the cutting blade has a slit which is open at an outer peripheral edge thereof, and the step of cutting the workpiece includes the step of cutting the workpiece while supplying a cutting fluid containing an organic acid and an oxidizing agent to the workpiece.

According to the method in accordance with the aspect of the present invention, the cutting fluid which contains an organic acid and an oxidizing agent is supplied to the cutting blade and the workpiece in severing the layered bodies containing metal with the cutting blade. The organic acid and the oxidizing agent are effective to modify the metal contained in the layered bodies, thereby lowering the ductility of the metal while the cutting blade is severing the layered bodies. The metal is thus prevented from forming burrs even when the workpiece is processed at an increased rate.

According to the method in accordance with the aspect of the present invention, the cutting blade having the slit defined therein which is open at the outer peripheral edge thereof is used. The slit allows the cutting fluid to be supplied efficiently therethrough to the layered bodies, so that the cutting fluid can sufficiently modify the metal contained in the layered bodies to lower the ductility of the metal while the cutting blade is severing the layered bodies. The metal is thus prevented from forming burrs even when the workpiece is processed at an increased rate. In other words, the rate at which the workpiece is processed can be increased while keeping the quality of the processing of the workpiece.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

A method of processing a workpiece according to an embodiment of the present invention will be described below with reference to the accompanying drawings. The method of processing a workpiece according to the present embodiment, also referred to as "workpiece processing method," is a method of processing a plate-shaped workpiece that includes layered bodies containing metal which are formed in superposed relation to projected dicing lines, and includes a holding step (see FIG. 2A) and a cutting step (see FIGS. 2B and 3).

In the holding step, a workpiece is held on a jig table (holding table) of a cutting apparatus. In the cutting step, while the workpiece is being supplied with a cutting fluid containing an organic acid and an oxidizing agent, the workpiece is cut along projected dicing lines with an annular cutting blade having a plurality of slits that are open in an outer peripheral edge thereof, severing (separating) the workpiece together with the layered bodies. The workpiece processing method according to the present embodiment will be described in detail below.

Figure 1A:
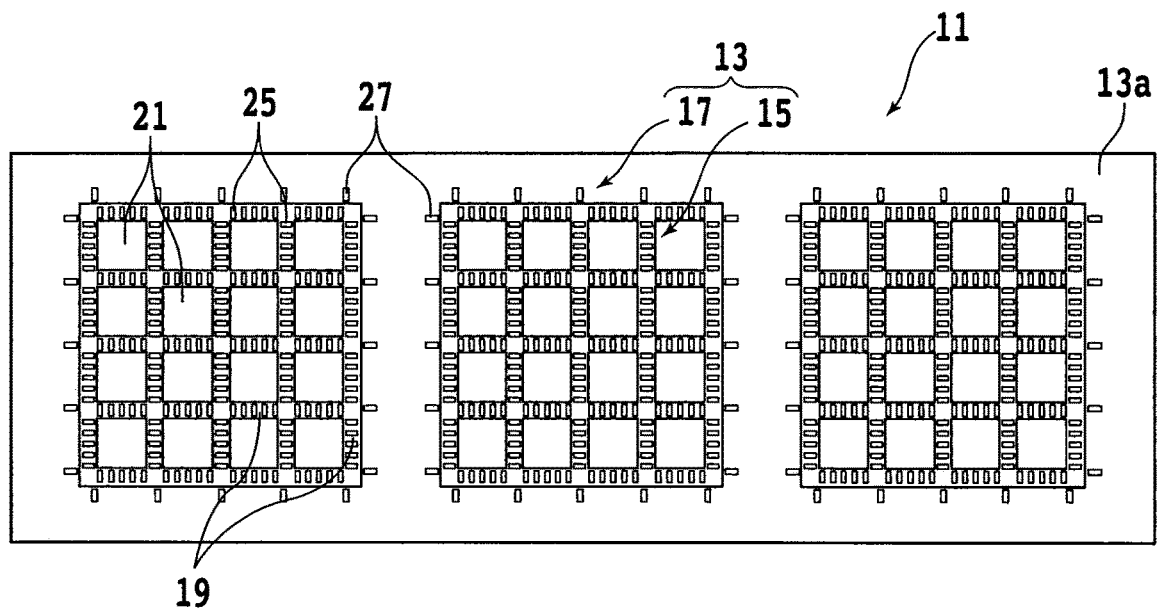
FIG. 1A is a plan view schematically showing a workpiece by way of example.
Figure 1B:
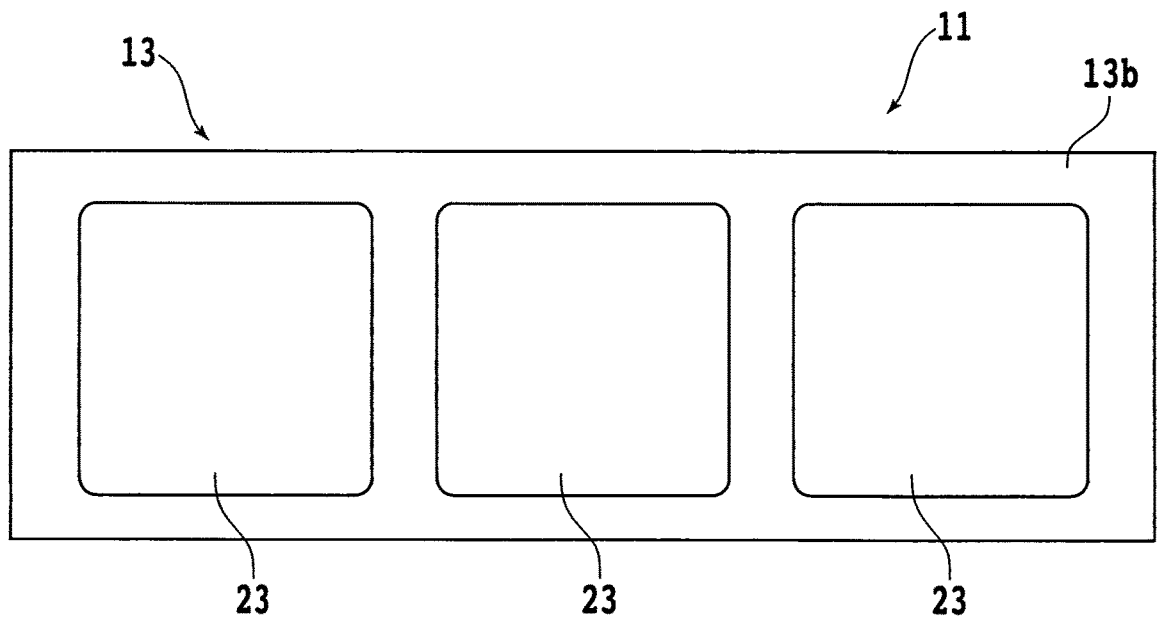
FIG. 1B is a bottom view of the workpiece.

FIG. 1A is a plan view schematically showing a workpiece 11 by way of example, which is to be processed by the workpiece processing method according to the present embodiment. FIG. 1B is a bottom view of the workpiece 11. As shown in FIGS. 1A and 1B, the workpiece 11 includes, for example, a packaged board with a plurality of device chips, not shown, encapsulated in resin, and includes a metal frame 13 that is of a rectangular shape as viewed in plan.

The frame 13 is made of a 42 alloy, i.e., an alloy of iron and nickel or a metal such as copper or the like. The frame 13 has a face side 13a divided into a plurality of (three in the embodiment) device areas 15 and a plurality of outer peripheral marginal areas 17 surrounding the respective device areas 15. Each of the device areas 15 is further demarcated into a plurality of areas by a grid of projected dicing lines or streets 19, the areas including respective stages 21.

A device chip, not shown, including devices such as ICs (Integrated Circuits), LEDs (Light-Emitting Diodes), MEMS (Micro Electro Mechanical Systems), etc. is disposed on the reverse side of each of the stages 21, i.e., on a reverse side 13b of the frame 13. Encapsulating resin layers 23 are formed in respective areas on the reverse side 13b of the frame 13 which correspond to the device areas 15, in covering relation to the device chips disposed on the reverse sides of the stages 21.

A plurality of layered bodies 25 containing metal are formed in superposed relation to the projected dicing lines 19 around each of the stages 21. The layered bodies 25 are exposed on the face side 13a of the frame 13 and connected to the electrodes of the device chips by metal wires, not shown, or the like. To each of the layered bodies 25, there are connected the electrodes of device chips that are disposed individually on two adjacent stages 21 one on each side of the layered body 25.

When the workpiece 11 is cut along the projected dicing lines 19 into packaged devices with encapsulated device chips, the layered bodies 25 are also separated. The severed layered bodies 25 act as the electrodes of the packaged devices. Markers 27 indicative of the positions of the projected dicing lines 19 are formed in the outer peripheral marginal areas 17 of the face side 13a of the frame 13.

According to the present embodiment, the packaged board in which the device chips are encapsulated by the encapsulating resin layers 23 serves as the workpiece 11. However, the workpiece 11 is not limited to particular materials, shapes, structures, sizes, etc. Similarly, the device chips, the devices, and the layered bodies 25 are not limited to particular kinds, quantities, shapes, structures, sizes, layouts, etc.

For example, a wafer in which layered bodies functioning as TEG (Test Element Group) are formed in superposed relation to projected dicing lines 19, or a wafer in which layered bodies containing metals such as titanium (Ti), nickel (Ni), gold (Au), etc. and functioning as electrodes are formed on a reverse side thereof may be used as the workpiece 11.

Figure 2A:
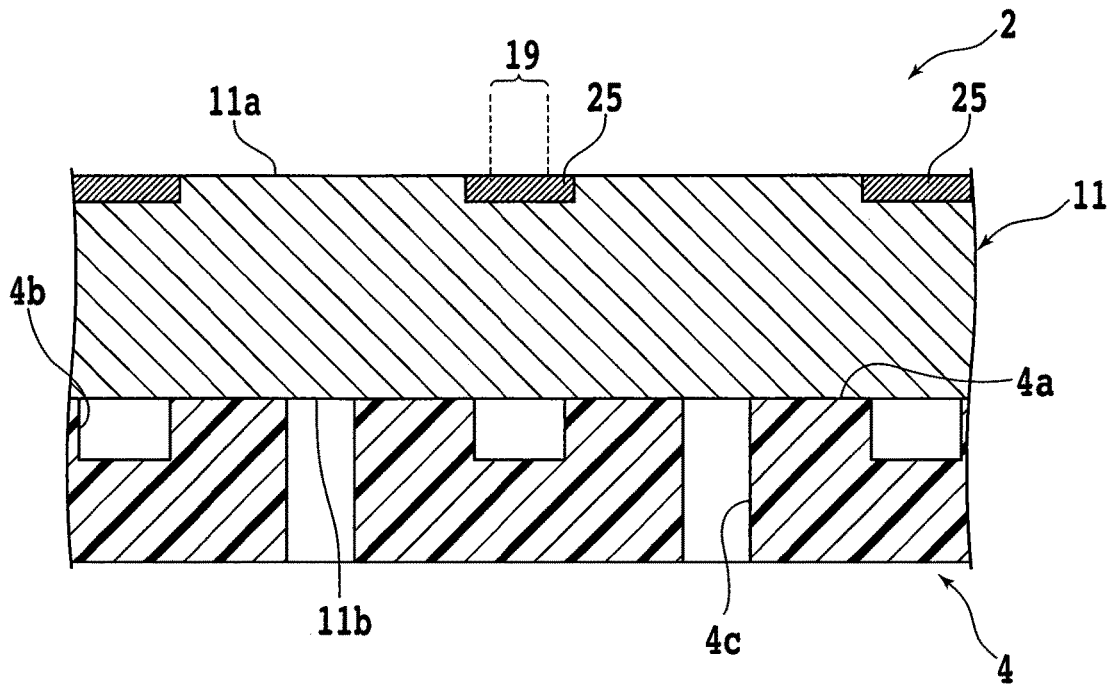
FIG. 2A is an enlarged fragmentary cross-sectional view illustrative of a holding step of a workpiece processing method according to an embodiment of the present invention.

In the workpiece processing method according to the present embodiment, the holding step is carried out to hold the above workpiece 11 on a jig table (holding table) of a cutting apparatus. FIG. 2A is an enlarged fragmentary cross-sectional view illustrative of the holding step. The holding step is performed using a cutting apparatus 2 shown in FIG. 2A, for example. In FIG. 2A, only the layered bodies 25 are shown as a component of the workpiece 11 for illustrative purposes.

As shown in FIG. 2A, the cutting apparatus 2 has a jig table (holding table) 4 for holding the workpiece 11 under suction. The jig table 4 is disposed above a jig base, not shown, connected to a suction source, not shown. The jig base is coupled to a rotary actuator, not shown, such as a motor or the like, for rotation about a rotational axis substantially parallel to a vertical direction. The jig base is disposed above a processing-feed mechanism, not shown, that moves the jig base in a processing feed direction.

The jig table 4 for holding the workpiece 11 thereon is detachably mounted on an upper surface of the jig base. The jig table 4 includes a flat plate that is of a rectangular shape as viewed in plan, for example, and has an upper surface part of which serves as a holding surface 4a for holding the workpiece 11 under suction thereon. The jig table 4 has a plurality of clearance grooves 4b defined therein on the holding surface 4a side for alignment with the respective projected dicing lines 19. The clearance grooves 4b have upper ends that are open at the holding surface 4a. The clearance grooves 4b divide the holding surface 4a into a plurality of areas corresponding to respective pieces or device chips into which the workpiece 11 is severed.

The jig table 4 also has a plurality of suction holes 4c defined vertically therethrough in the respective areas divided by the clearance grooves 4b, the suction holes 4c being open at the holding surface 4a and a lower surface of the jig table 4 that is opposite the holding surface 4a. When the jig table 4 is installed on the upper surface of the jig base, the suction holes 4c are connected to the suction source through suction channels defined in the jig base.

In the holding step, the workpiece 11 is placed on the holding surface 4a of the jig table 4 such that the workpiece 11 has a reverse side 11b, i.e., the encapsulating resin layers 23 side or the reverse side 13b of the frame 13, facing downwardly, with the projected dicing lines 19 being aligned with the respective clearance grooves 4b. Then, a negative pressure from the suction source is caused to act on the reverse side 11b of the workpiece 11 through the suction holes 4c. The workpiece 11 is now held under suction on the jig table 4 such that the workpiece 11 has a face side 11a, i.e., the face side 13a of the frame 13, exposed upwardly.

Figure 2B:
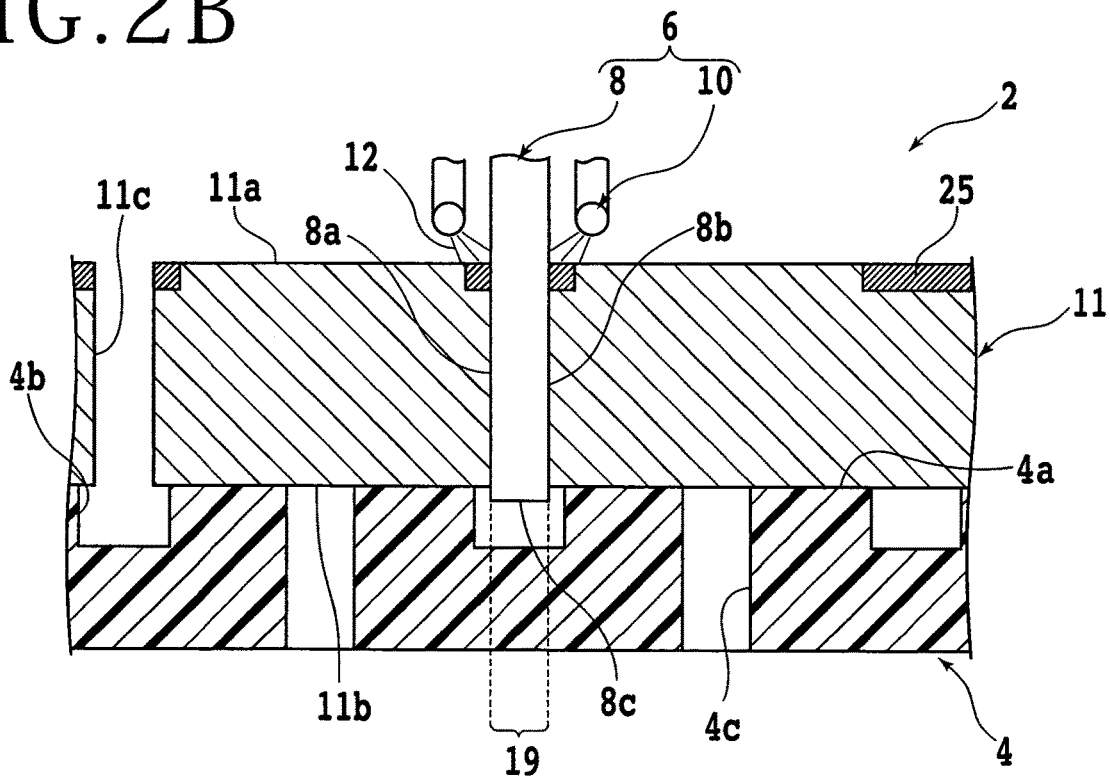
FIG. 2B is a side elevational view, partly in cross section, illustrative of a cutting step of the workpiece processing method according to the embodiment.

The holding step is followed by a cutting step to cut the workpiece 11 along the projected dicing lines 19, severing (separating) the workpiece 11 together with the layered bodies 25. FIG. 2B is a side elevational view, partly in cross section, illustrative of the cutting step. The cutting step is performed also using the cutting apparatus 2. As shown in FIG. 2B, the cutting apparatus 2 also includes a cutting unit 6 disposed above the jig table 4.

The cutting unit 6 has a spindle, not shown, that serves as a rotational shaft substantially perpendicular to the processing-feed direction. An annular cutting blade 8 made of a binder with abrasive grains dispersed therein is mounted on one end of the spindle. The other end of the spindle is coupled to a rotary actuator, not show, such as a motor or the like. The cutting blade 8 on the one end of the spindle is rotatable about its own axis by forces transmitted from the rotary actuator.

The spindle is supported by a moving mechanism, not shown, which moves the cutting blade 8 in an indexing-feed direction perpendicular to the processing-feed direction and a vertical direction perpendicular to the processing-feed direction and the indexing-feed direction. A pair of nozzles 10 are disposed on the sides of a face side 8a and a reverse side 8b of the cutting blade 8, which is thus disposed between the nozzles 10. The nozzles 10 are arranged to supply a cutting fluid 12 to the cutting blade 8 and the workpiece 11.

Each of the clearance grooves 4b has a width larger than the width of the cutting blade 8, i.e., the distance between the face side 8a and the reverse side 8b thereof, for example, and a depth larger than the distance by which the cutting blade 8 projects downwardly from the reverse side 11b of the workpiece 11 when cutting through the workpiece 11. Therefore, when the cutting blade 8 cuts deeply into the workpiece 11 along the projected dicing lines 19, the cutting blade 8 is kept out of contact with the jig table 4.

Figure 3:
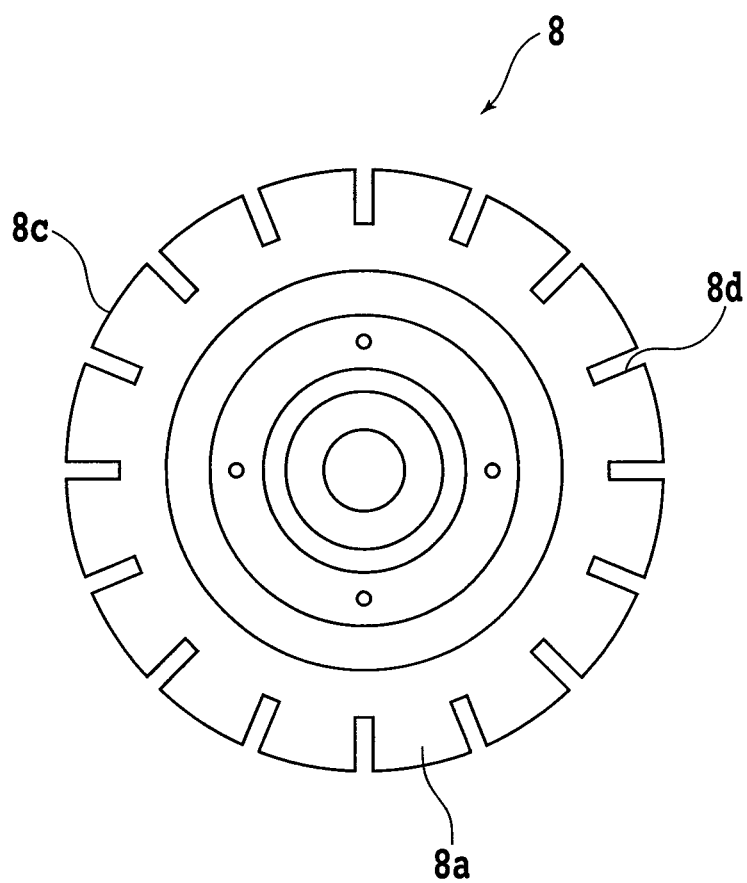
FIG. 3 is a front elevational view schematically showing a cutting blade.

According to the present embodiment, the cutting blade 8 that has a plurality of slits defined therein which are open at an outer peripheral edge thereof. Specifically, FIG. 3 is a front elevational view schematically showing the cutting blade 8. As shown in FIG. 3, the cutting blade 8 has a plurality of slits 8d defined in the outer peripheral portion thereof and open at an outer peripheral edge 8c thereof. The slits 8d extend axially in a direction substantially parallel to the spindle that serves as the rotational shaft of the cutting unit 6. The cutting fluid 12 from the nozzles 10 is efficiently supplied to the layered bodies 25 via the slits 8d.

In the cutting step, the jig table 4 is rotated about its own axis to bring a target projected dicing line 19 into alignment with the processing-feed direction of the cutting apparatus 2. The jig table 4 and the cutting unit 6 are moved relatively to each other to position the plane of the cutting blade 8 into alignment with an extension of the target projected dicing line 19. Then, the lower end of the cutting blade 8 is moved to a position lower than the reverse side 11b of the workpiece 11.

Thereafter, while the cutting blade 8 is rotated about its own axis, the jig table 4 is moved in the processing-feed direction. At the same time, the nozzles 10 supply the cutting fluid 12 which contains an organic acid and an oxidizing agent to the cutting blade 8 and the workpiece 11. The cutting blade 8 cuts into the workpiece 11 along the target projected dicing line 19, fully severing the workpiece 11 together with the layered bodies 25 on the target projected dicing line 19 thereby to form a kerf (slit) 11c thicknesswise in the layered bodies 25 and the workpiece 11 along the target projected dicing line 19.

The organic acid contained in the cutting fluid 12 modifies the metal in the layered bodies 25 to restrain its ductility. The oxidizing agent contained in the cutting fluid 12 makes it easier for the metal in the layered bodies 25 to be oxidized on its surface. As a result, the ductility of the metal in the layered bodies 25 is sufficiently lowered for increased processability of the workpiece 11.

As the organic acid contained in the cutting fluid 12, there can be used, for example, a compound that has at least one carboxyl group and at least one amino group in its molecule. In this case, it is preferable that at least one of the amino group(s) is a secondary or tertiary amino group. In addition, the compound used as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N,N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent contained in the cutting fluid 12, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 12. Mixing of the anticorrosive makes it possible to prevent corrosion (elution) of the metal included in the workpiece 11. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

The above process is repeated to cut to form kerfs 11c along all the projected dicing lines 19, whereupon the cutting step is finished. According to the present embodiment, as described above, the cutting fluid 12 which contains an organic acid and an oxidizing agent is supplied to the cutting blade 8 and the workpiece 11 in severing the layered bodies 25 that contain metal with the cutting blade 8. The organic acid and the oxidizing agent are effective to modify the metal contained in the layered bodies 25, thereby lowering the ductility of the metal while the cutting blade 8 is severing the layered bodies 25. The metal is thus prevented from forming burrs even when the workpiece 11 is processed at an increased rate.

In the workpiece processing method according to the above embodiment, the cutting blade 8 having the slits 8d defined therein which are open at the outer peripheral edge 8c thereof is used. The slits 8d allow the cutting fluid 12 to be supplied efficiently therethrough to the layered bodies 25, so that the cutting fluid 12 can sufficiently modify the metal contained in the layered bodies 25 to lower the ductility of the metal while the cutting blade 8 is severing the layered bodies 25. The metal is thus prevented from forming burrs even when the workpiece 11 is processed at an increased rate. In other words, the rate at which the workpiece 11 is processed can be increased while keeping the quality of the processing of the workpiece 11.

The present invention is not limited to the above embodiment, but various changes and modifications may be made therein. For example, in the cutting step according to the above embodiment, the face side 11a of the workpiece 11 is exposed upwardly, and the cutting blade 8 cuts into the workpiece 11 from the face side 11a. However, the reverse side 11b of the workpiece 11 may be exposed upwardly, and the cutting blade 8 may cut into the workpiece 11 from the reverse side 11b in the cutting step.

In the cutting step according to the above embodiment, moreover, the workpiece 11 together with the layered bodies 25 are severed (separated). However, in the cutting step, at least the layered bodies 25 may be separated. In other words, the workpiece 11 may not be severed in the cutting step.

In the cutting step according to the above embodiment, the cutting blade 8 that has the slits 8d extending axially in a direction substantially parallel to the spindle that serves as the rotational shaft of the cutting unit 6 is used. The slits 8d are not limited to particular layouts, quantities, shapes, sizes, etc. For example, a cutting blade having one or more slits defined therein which are open at the outer peripheral edge thereof and which extend along a circumferential direction may be used.

Figure 4:
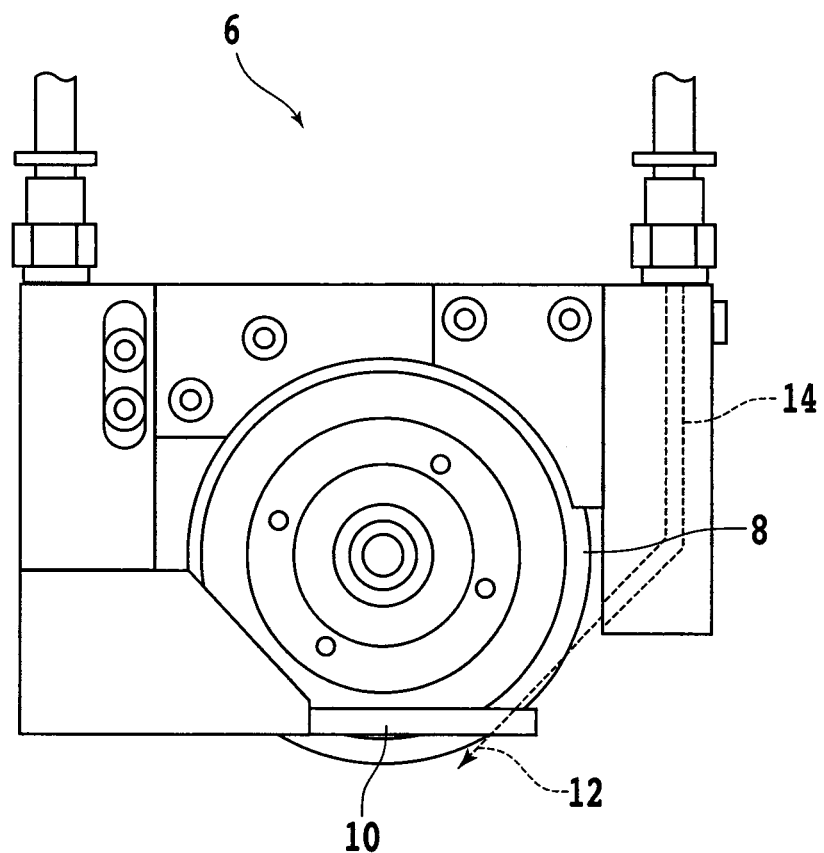
FIG. 4 is a front elevational view of a nozzle for supplying a cutting fluid according to another mode of the present invention.

In the above cutting step, the cutting fluid 12 is supplied from the nozzles 10 disposed on both sides of the cutting blade 8. However, the present invention is not limited to any particular nozzle configuration for supplying the cutting fluid 12. FIG. 4 is a front elevational view of a nozzle for supplying the cutting fluid 12 according to another mode of the present invention. As shown in FIG. 4, a cutting unit 6 includes, in addition to the cutting blade 8 and the pair of nozzles 10, a shower nozzle 14 disposed laterally of the cutting blade 8, i.e., in front of the cutting blade 8 with respect to the direction along which the cutting of the workpiece 11 by the cutting blade 8 progresses.

The nozzle 14 makes it easier to supply the cutting fluid 12 to the kerf (slit) 11c for more effectively modifying the metal contained in the layered bodies 25. In particular, the nozzle 14 has an ejection port oriented obliquely downwardly toward a region where the cutting blade 8 processes the workpiece 11, as shown in FIG. 4, so that the kerf 11c is supplied and filled with an increased amount of cutting fluid 12 for more effectively modifying the metal contained in the layered bodies 25. Though both the nozzles 10 and the nozzle 14 are used in FIG. 4, the nozzles 10 may be dispensed with and only the nozzle 14 may be used alone.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a plate-shaped workpiece that includes layered bodies containing metal which are formed in superposed relation to projected dicing lines, comprising the steps of:
    holding the workpiece on a holding table; and
    thereafter, performing a step of cutting the workpiece along the projected dicing lines with an annular cutting blade that is generally rectangular in cross-section, thereby separating the layered bodies via a cut groove, wherein said annular cutting blade contacts the layered bodies while forming the cut groove during said cutting step;

wherein the annular cutting blade has a slit which is open at an outer peripheral edge thereof; and said step of cutting the workpiece includes the step of cutting the workpiece while supplying a cutting fluid containing an organic acid and an oxidizing agent to the workpiece, wherein the oxidizing agent is selected from the group consisting of: hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron (III) salts, and their organic complex salts; and further wherein the organic acid and the oxidizing agent are effective to modify the metal contained in the layered bodies, thereby lowering the ductility of the metal while the cutting blade is performing said step of cutting.

2. The method according to claim 1, wherein the cutting fluid also comprises an anticorrosive, and further wherein the anticorrosive includes a heterocyclic aromatic ring compound which has at least three nitrogen atoms in its molecule.

3. The method according to claim 2, wherein the heterocyclic aromatic ring compound includes a carboxyl group, a sulfo group, a hydroxyl group, or a alkoxyl group.

4. The method according to claim 2, wherein the heterocyclic aromatic ring compound includes tetrazole derivatives, 1,2,3-triazole derivatives, or 1,2,4-triazole derivatives.

5. The method according to claim 1, wherein the cutting fluid also comprises an anticorrosive, and further wherein the anticorrosive includes a fused ring structure or a heterocyclic aromatic ring compound which has at least four nitrogen atoms in its molecule.

6. The method according to claim 5, wherein the heterocyclic aromatic ring compound includes a carboxyl group, a sulfo group, a hydroxyl group, or a alkoxyl group.

7. The method according to claim 5, wherein the heterocyclic aromatic ring compound includes tetrazole derivatives, 1,2,3-triazole derivatives, or 1,2,4-triazole derivatives.

8. A method of processing a plate-shaped workpiece that includes layered bodies containing metal which are formed in superposed relation to projected dicing lines, comprising the steps of:

holding the workpiece on a holding table; and thereafter, performing a step of cutting the workpiece along the projected dicing lines with an annular cutting blade that is generally rectangular in cross-section, thereby separating the layered bodies via a cut groove, wherein said annular cutting blade contacts the layered bodies while forming the cut groove during said cutting step;

wherein the annular cutting blade has a slit which is open at an outer peripheral edge thereof; and said step of cutting the workpiece includes the step of cutting the workpiece while supplying a cutting fluid containing an organic acid and an oxidizing agent to the workpiece;

wherein the oxidizing agent is selected from the group consisting of: hydrogen peroxide, peroxides, nitrates, iodates, periodates, hypochlorites, chlorites, chlorates, perchlorates, persulfates, dichromates, permanganates, cerates, vanadates, silver(II) salts, iron(III) salts, and their organic complex salts; and further wherein the organic acid and the oxidizing agent are effective to modify the metal contained in the layered bodies, thereby lowering the ductility of the metal while the cutting blade is performing said step of cutting.

9. The method according to claim 8, wherein the cutting fluid also comprises an anticorrosive, and further wherein the anticorrosive includes a heterocyclic aromatic ring compound which has at least three nitrogen atoms in its molecule.

10. The method according to claim 9, wherein the heterocyclic aromatic ring compound includes a carboxyl group, a sulfo group, a hydroxyl group, or a alkoxyl group.

11. The method according to claim 9, wherein the heterocyclic aromatic ring compound includes tetrazole derivatives, 1,2,3-triazole derivatives, or 1,2,4-triazole derivatives.

12. The method according to claim 8, wherein the cutting fluid also comprises an anticorrosive, and further wherein the anticorrosive includes a fused ring structure or a heterocyclic aromatic ring compound which has at least four nitrogen atoms in its molecule.

13. The method according to claim 8, wherein:

the cutting fluid also comprises an anticorrosive, and further wherein the anticorrosive includes a heterocyclic aromatic ring compound which has at least four nitrogen atoms in its molecule, and the heterocyclic aromatic ring compound includes a carboxyl group, a sulfo group, a hydroxyl group, or a alkoxyl group.

14. The method according to claim 8, wherein:

the cutting fluid also comprises an anticorrosive, and further wherein the anticorrosive includes a heterocyclic aromatic ring compound which has at least four nitrogen atoms in its molecule, and the heterocyclic aromatic ring compound includes tetrazole derivatives, 1,2,3-triazole derivatives, or 1,2,4-triazole derivatives.

* * * * *